US006562735B1

(12) United States Patent
Allman et al.

(10) Patent No.: US 6,562,735 B1
(45) Date of Patent: May 13, 2003

(54) CONTROL OF REACTION RATE IN FORMATION OF LOW K CARBON-CONTAINING SILICON OXIDE DIELECTRIC MATERIAL USING ORGANOSILANE, UNSUBSTITUTED SILANE, AND HYDROGEN PEROXIDE REACTANTS

(75) Inventors: Derryl D. J. Allman, Camas, WA (US); Ponce Saopraseuth, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/015,255

(22) Filed: Dec. 11, 2001

(51) Int. Cl.[7] ............................................... H01L 21/31

(52) U.S. Cl. ................... 438/790; 438/758; 438/780; 438/787; 438/789

(58) Field of Search ............................ 438/758, 780, 438/787, 789, 790

(56) References Cited

U.S. PATENT DOCUMENTS

| | | | |
|---|---|---|---|
| 5,874,367 A | 2/1999 | Dobson | 438/787 |
| 5,930,655 A | 7/1999 | Cooney, III | |
| 5,989,998 A | 11/1999 | Sugahara et al. | |
| 6,001,747 A | * 12/1999 | Annapragada | 438/790 |
| 6,043,145 A | 3/2000 | Suzuki et al. | |
| 6,054,379 A | 4/2000 | Yau | |
| 6,063,702 A | 5/2000 | Chung | |
| 6,215,087 B1 | 4/2001 | Akahori et al. | |
| 6,316,354 B1 | * 11/2001 | Hu | 438/652 |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.
Dobson, C.D., et al., "Advanced $SiO_2$ Planarization Using Silane and $H_2O_2$", *Semiconductor International*, Dec. 1994, pp. 85–88.
McClatchie, S., et al., "Low Dielectric Constant Oxide Films Deposited Using CVD Techniques", *1998 Proceedings Fourth International DUMIC Conference*, Feb. 16–17, 1998, pp. 311–318.
Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.
Peters, Laura, "Pursuing the Perfect Low–k Dielectric", *Semiconductor International*, vol. 21, No. 10, Sep., 1998, pp. 64–66, 68, 70, 72, and 74.

* cited by examiner

*Primary Examiner*—Kamand Cuneo
*Assistant Examiner*—Lisa Kilday
(74) *Attorney, Agent, or Firm*—John P. Taylor

(57) ABSTRACT

Control of a reaction between a peroxide oxidizing agent and a carbon-substituted silane to form a low k carbon-containing silicon oxide dielectric material is achieved, in a first embodiment, by adding, to the carbon-substituted silane reactant, silane ($SiH_4$), to accelerate the process for forming a low k carbon-containing silicon oxide dielectric material by reaction of the carbon-substituted silane/silane mixture with hydrogen peroxide. Also, control of a reaction between a peroxide oxidizing agent and a carbon-substituted silane to form a low k carbon-containing silicon oxide dielectric material is achieved by controlling the ratio of the flow of the hydrogen peroxide reactant and the flow of the reactant mixture of carbon-substituted silane and unsubstituted silane into the reaction chamber though structural modification of the faceplate (showerhead) through which the reactants flow into the chamber.

27 Claims, 2 Drawing Sheets

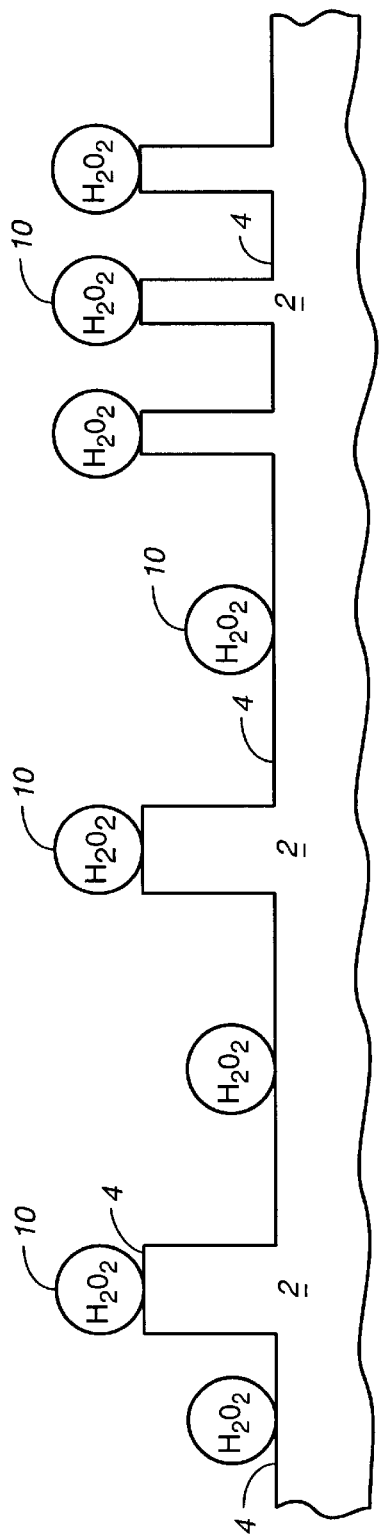
FIG._1
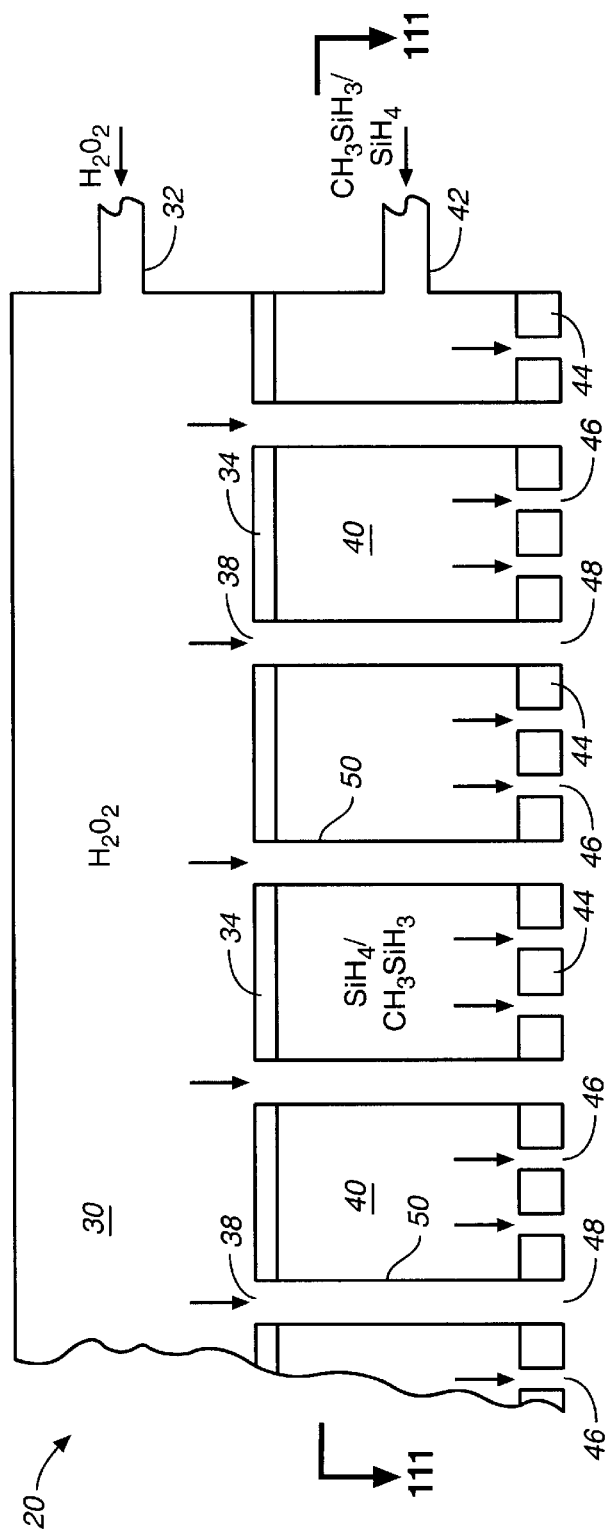
FIG._2

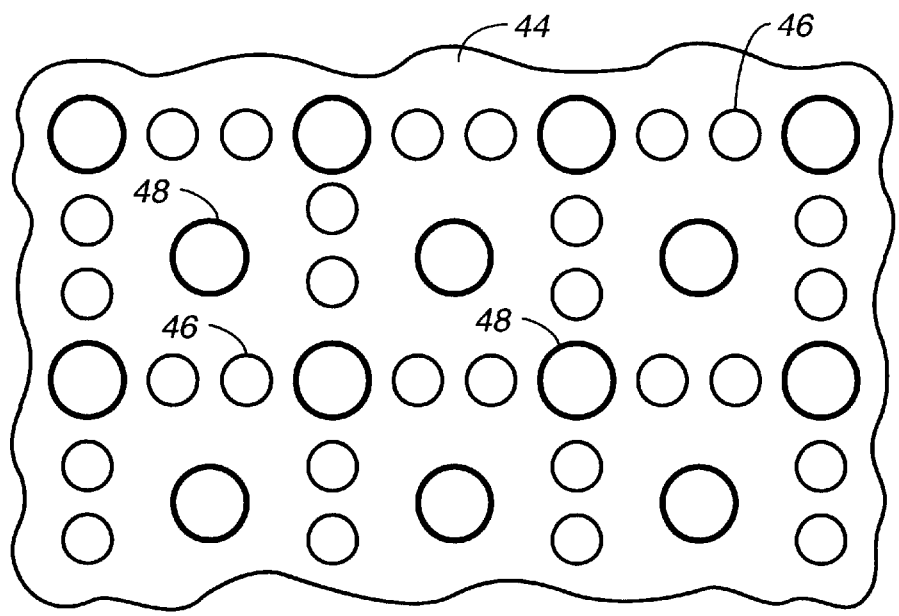
FIG._3
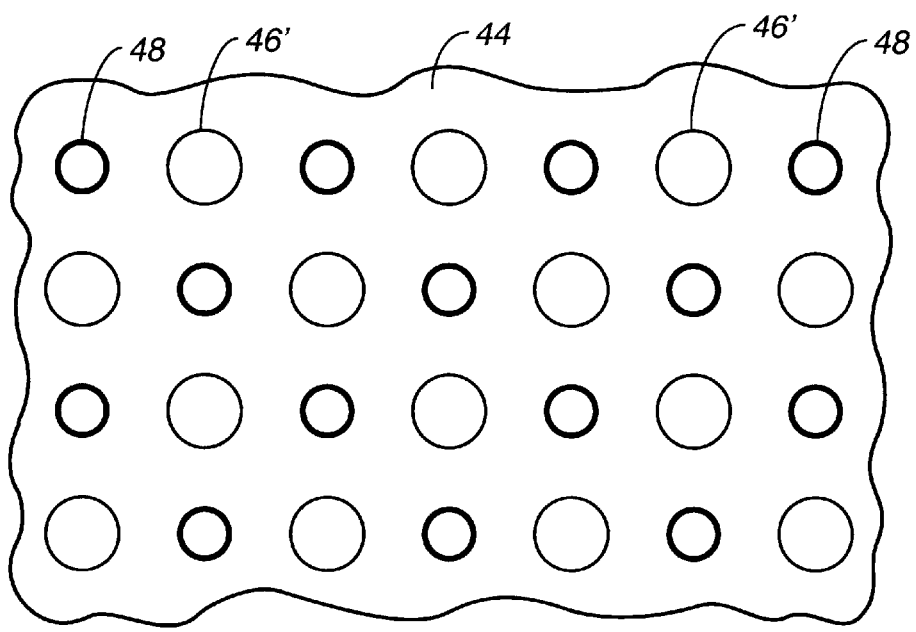
FIG. 4

CONTROL OF REACTION RATE IN FORMATION OF LOW K CARBON-CONTAINING SILICON OXIDE DIELECTRIC MATERIAL USING ORGANOSILANE, UNSUBSTITUTED SILANE, AND HYDROGEN PEROXIDE REACTANTS

CROSS REFERENCE TO RELATED APPLICATIONS

The subject matter of this application relates to the subject matter of copending Sukharev U.S. patent application Ser. No. 09/274,254 entitled "FORMATION OF IMPROVED LOW DIELECTRIC CONSTANT CARBON-CONTAINING SILICON OXIDE DIELECTRIC MATERIAL BY REACTION OF CARBON-CONTAINING SILANE WITH OXIDIZING AGENT IN THE PRESENCE OF ONE OR MORE REACTION RETARDANTS", assigned to the assignee of this application, and the subject matter of which is hereby incorporated herein by reference.

BACKGROUND OF THE INVENTION

1. Field of the Invention

This invention relates to a process for forming integrated circuit structures. More particularly, this invention relates to a process for forming a layer of low dielectric constant (low k) dielectric material in an integrated circuit structure.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$): to form monosilicic acid which condenses on a cool wafer and is converted into an amorphous methyl-doped silicon oxide which is annealed at 400° C. to remove moisture. The article goes on to state that beyond methyl silane, studies show a possible k of 2.75 using dimethyl silane in the Flowfill process.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The incorporation of such carbon-doped silicon oxide dielectric material into interconnect architecture has been very attractive not only because of the low k properties, but also because of the compatibility with conventional silicon process technologies. Generally these materials remain stable upon annealing; at temperatures of up to 500° C. The carbon doped silicon oxide materials are characterized by the structure of amorphous silicon oxide with incorporated methyl groups and hydrogen species, and are also characterized by a reduced density in comparison with conventional silicon oxide that can be explained by the formation of microporosity surrounding the incorporated methyl groups. Furthermore, such hydrocarbon-modified silicon oxide dielectric materials deposited by CVD techniques are also characterized by strong adhesion.

The above discussed reaction of methyl silane and hydrogen peroxide has been found to result in the formation of a low k Carbon-containing silicon oxide dielectric material with excellent fill properties in high aspect ratio regions of an integrated circuit structure such as between closely spaced apart metal lines or in narrow isolation trenches. However, it has been found that the reaction rate between the reactants must be controlled so that it is neither too slow or too fast. If the reaction is too slow, an uneven reaction appears to occur across the surface of the substrate. The results also appear to be apparatus sensitive, i.e., with results differing from one reaction chamber to another.

On the other hand, if the reaction is too fast, the result is pressure spiking wherein momentary pressure bursts can cause poor: across-wafer thickness uniformity of the deposited film, as well as a "haze" or condensation problem. In the aforementioned Sukharev U.S. patent application Ser. No. 09/274,254, it is stated that the pressure spikes sometimes are high enough to actually stop the reaction by increasing the pressure in the reaction chamber sufficiently to interfere with the flow of reactants into the chamber. Sukharev further states that such pressure spiking and resultant rise in pressure can result in the precipitation of particles of the reaction product in the gas phase and their subsequent deposition on the substrate surface.

Sukharev stated that pressure spiking could be avoided by varying the $CH_3SiH_3/H_2O_2$ concentration ratio and/or total flows, but that the multi-factor character of such optimization would make it difficult to develop reliable technology by means of the process parameter variations only.

Sukharev then proposed to control the reaction rate between the carbon-doped silane and the peroxide oxidizing agent by the addition of one or more reaction-retarding additives such as an inorganic compound selected from the group consisting of: $Cl_2$, $Br_2$, $I_2$, HF, HCl, HBr, HI, $N_2$, NO, $NO_2$, $N_2O$, $H_2S$, CO, $CO_2$, $NH_3$, $SO_2$, $H_2$, Kr, Ar, Ne, and He; an organic compound selected from the group consisting of: a 1–6 carbon alkane, a 1–6 carbon alkene, a 1–6 carbon alkyne, a 1–6 carbon alcohol, a 1–6 carbon aldehyde, a 1–6 carbon ketone, a 1–6 carbon carboxylic acid, a 1–10 carbon aromatic, and any of the above organic compounds having one or more atoms therein selected from the group consisting of F, Cl, Br, I, S, N, and P; and mixtures of any 2 or more of the above.

It, therefore, remains desirable to provide for control of the reaction rate of the carbon-doped silane with the peroxide oxidizing agent used to form low k carbon-doped silicon oxide dielectric material so that the reaction rate is neither too fast or too slow.

SUMMARY OF THE INVENTION

Control of a reaction between a peroxide oxidizing agent and a carbon-substituted silane to form a low k carbon-containing silicon oxide dielectric material is achieved, in a first embodiment, by adding, to the carbon-substituted silane reactant, unsubstituted silane (SiH$_4$), to accelerate the process for forming a low k carbon-containing silicon oxide dielectric material by reaction of the carbon-substituted silane/unsubstituted silane mixture with hydrogen peroxide.

In a second embodiment, control of a reaction between a peroxide oxidizing agent and a reactant mixture comprising carbon-substituted silane and unsubstituted silane to form a low k carbon-containing silicon oxide dielectric material is achieved by controlling the ratio of the flow of the hydrogen peroxide reactant and the flow of the reactant mixture of carbon-substituted silane and unsubstituted silane into a reaction chamber though structural modification of the faceplate of the showerhead through which the reactants flow into the chamber.

BRIEF DESCRIPTION OF THE DRAWINGS

FIG. 1 is a fragmentary vertical cross-sectional view of an integrated circuit structure illustrating the two types of reactions thought to be occurring in the reaction chamber when silane is added to the reactants.

FIG. 2 is a fragmentary vertical cross-sectional view of a second embodiment of the invention showing the modification to the faceplate of the showerhead used to introduce the peroxide oxidizing agent and a reactant mixture comprising carbon-substituted silane and unsubstituted silane into a reaction chamber where the low k carbon-containing silicon oxide dielectric material is formed.

FIG. 3 is a top view of the structure of FIG. 2 taken along lines III—III.

FIG. 4 is a top view of another variation of the modified faceplate of the second embodiment of the invention.

DETAILED DESCRIPTION OF THE INVENTION

The invention comprises a process for controlling a reaction between a peroxide oxidizing agent and a carbon-substituted silane to form a low k carbon-containing silicon oxide dielectric material. In a first embodiment, the process comprises adding, to the peroxide oxidizing agent and the carbon-substituted silane reactant, unsubstituted silane (SiH$_4$), to accelerate the process for forming a low k carbon-containing silicon oxide dielectric material. In a second embodiment, control of the reaction between a peroxide oxidizing agent and a reactant mixture of a carbon-substituted silane and an unsubstituted silane to form a low k carbon-containing silicon oxide dielectric material is achieved by controlling the ratio of the flow of the hydrogen peroxide reactant and the flow of the reactant mixture of carbon-substituted silane and unsubstituted silane into the reaction chamber though structural modification of the faceplate of the showerhead through which the reactants flow into the chamber.

The term "low k", as used herein, is intended to define a dielectric constant of a dielectric material of 3.5 or less. Preferably, the dielectric constant of a "low k" material will be not be greater than 3.1, and most preferably not greater than 2.7.

The term "carbon-substituted silane" is meant to include alkyl silanes such as methyl silane and dimethyl silane as well as other organo silanes such as, for example, the carbon-substituted silanes disclosed in Aronowitz et al. U.S. Pat. No. 6,303,047, assigned to the assignee of this application, and the subject matter of which is hereby incorporated herein by reference.

In the first embodiment of the invention, the reaction rate to form the low k carbon-containing silicon oxide dielectric material is controlled by the addition of unsubstituted silane (SiH$_4$} to the flow of the carbon-substituted silane reactant, with the unsubstituted silane additive acting as an accelerant for the reaction. The minimum amount of unsubstituted silane additive which should be added to the reactant flow is that amount which will reduce the reaction time by a desired amount while still depositing the same thickness of the low k dielectric material. Typically this minimum amount of unsubstituted silane additive will be that amount which will approximately double the reaction rate.

That is, for example, if the reaction takes 1.2 minutes to form and deposit the desired thickness of low k carbon-containing silicon oxide dielectric material without the use of the unsubstituted silane additive, the reaction should be speeded up to obtain the same formation and deposition in about 40 seconds, if it is desired to approximately halve the formation time. In accordance with the invention, the minimum amount of unsubstituted silane reactant to be added to the carbon-substituted silane reactant to achieve this reduction in reaction time is about 3 mole % of the resulting total mixture.

The addition of unsubstituted silane to the carbon-substituted silane reactant flow will not only speed up the reaction to form the desired low k carbon-containing silicon oxide dielectric product, but will also act to raise the dielectric constant of the low k dielectric product, since the overall amount of carbon being incorporated into the low k dielectric product has been reduced (because the unsubstituted silane additive replaces some of the carbon-substituted silane in the reaction). Therefore, the maximum amount of unsubstituted silane additive used in the reaction should be the maximum amount of unsubstituted silane additive which is still below that amount of unsubsiituted silane additive which will increase the dielectric constant of the product to above 3.1.

For example, when hydrogen peroxide and methyl silane (CH$_3$SiH$_3$) are reacted together in a reactor for 1.2 minutes to form a 600 nm thick layer of low k carbon-substituted silicon oxide dielectric layer on a semiconductor substrate, the minimum amount of unsubstituted silane additive which should be added to reduce the deposition time to 40 seconds or less is 16 mole %, resulting in a mixture of 84 mole % methyl silane and 16 mole % unsubstituted silane additive; while the maximum amount of unsubstituted silane additive which may be used to still achieve a low k carbon-containing silicon oxide dielectric material having a dielectric constant not exceeding about 3.1 in the product is 27 mole %, resulting in a mixture of 73 mole % methyl silane and 27 mole % unsubstituted silane additive.

As shown in FIG. 1, the reaction between the hydrogen peroxide reactant and the methyl silane is a surface reaction wherein the hydrogen peroxide is shown at 10 as initially adsorbed onto the exposed upper surfaces 4 of integrated circuit structure 2 on a substrate (not shown). When the methyl silane reactant reaches the adsorbed hydrogen peroxide reactant on exposed surfaces 4, the two reactants react on exposed surfaces 4 of integrated circuit structure 2 to form low k carbon-containing 'silicon oxide dielectric material on exposed surfaces 4.

In contrast, the unsubstituted silane additive reacts with the hydrogen peroxide reactant in a gas phase reaction which occurs above exposed surfaces 4 of integrated circuit structure 2, resulting in formation of a silicon oxide dielectric material which falls onto surfaces 4 where it mixes with the low k carbon-containing silicon oxide dielectric material being concurrently formed thereon. The result is an accelerated overall process which results in a low k carbon-containing silicon oxide dielectric product having a higher dielectric constant than if no unsubstituted silane had been used in the reaction. As long as the amount of silane additive is controlled to not result in a low k dielectric product with a dielectric constant exceeding 3.1, the use of an unsubstituted silane additive to accelerate the reaction and formation of the low k carbon-containing silicon oxide dielectric material should be satisfactory.

However, in many instances, it will also be desirable to form a low k carbon-containing silicon oxide dielectric material wherein the ratio of the hydrogen peroxide reactant and the reactant mixture of carbon-substituted silane and unsubstituted silane additive is reproducibly controlled as well as the ratio of the silanes in the reactant mixture of carbon-substituted silane and unsubstituted silane. While the above-referenced Sukharev U.S. patent application Ser. No. 09/274,254, states that pressure spiking can be avoided by varying the $CH_3SiH_3/H_2O_2$ concentration ratio and/or total flows, Sukharev warns that the multi-factor character of such optimization makes it difficult to develop reliable technology by means of the process parameter variations only. That is, the process has been found to be very sensitive to even small changes in temperature, pressure, and flow rates.

In accordance with the second embodiment of the process of the invention, control of the reaction rate between hydrogen peroxide and the mixture of unsubstituted silane and carbon-substituted silane reactants to reproducibly form a layer of low k carbon-containing silicon oxide dielectric material can be carried out by modifying the faceplate of the showerhead to more accurately control the ratio of the hydrogen peroxide reactant and the reactant mixture of unsubstituted silane and carbon-substituted silane. Modification of the showerhead faceplate includes 1) adjustment of the ratio of the total area of the openings for the mixture of silane reactants to the total area of the peroxide openings; 2) alloy content of the showerhead faceplate; and 3) control of the surface roughness of the faceplate of the showerhead.

Turning now to FIGS. 2–4, shown is a fragmentary portion of a showerhead, made from an aluminum alloy (as will be discussed below), and used to introduce gaseous reactants into a reactor (not shown) such as a CVD reactor. The showerhead., generally indicated at arrow 20 in FIG. 2, comprises an upper plenum 30 having a gas inlet 32 which is connected to a source of hydrogen peroxide (not shown), and separated from a second. lower, plenum 40 by a bottom wall 34. Lower plenum 40, is connected by a gas inlet 42 to a source of a gaseous mixture of carbon-substituted silane and unsubstituted silane (not shown). The bottom wall of plenum 40 comprises a faceplate 44 having a plurality of first openings 46 therein through which the gaseous mixture of carbon-substituted silane and unsubstituted silane flows into the reactor.

The hydrogen peroxide reactant in upper plenum 30 is introduced into the reactor using pipes 50 which extend between openings 38 in bottom wall 34 of upper plenum 30 and second openings 48 in faceplate 44 to thereby permit passage of the hydrogen peroxide reactant from the first upper plenum through the second lower plenum into the reactor without preliminary contact between the hydrogen peroxide reactant and the gaseous mixture of carbon-substituted silane and unsubstituted silane before the respective gaseous reactants pass through openings 46 and 48 in faceplate 44 of showerhead 20 into the reactor.

To control the ratio of peroxide reactant to the reactant mixture of carbon-substituted silane and unsubstituted silane in the reactor, the total areas of openings 46 in faceplate 44 (through which the gaseous reactant mixture of carbon-substituted silane and unsubstituted silane flows into the reactor) is controlled relative to the total areas of openings 48 (through which the peroxide reactant flow into the reactor). FIG. 2 shows, for illustrative purposes only, an exaggerated increase in the total area of openings 46 compared to the total area of openings 48. The minimum ratio of the total areas of openings 46 to the total areas of openings 48 is 0.5:1, since a ratio lower than this would result in too large of an excess of peroxide reactant which is not desirable because the reaction rate would increase resulting in lower carbon content and higher dielectric constant material. Furthermore, the surface mobility of the reactant components would be reduced resulting in a decrease of the gap filling capabilities of the carbon-containing silicon oxide dielectric material formed in the reaction.

The maximum ratio of the total areas of openings 46 (mixture of carbon-substituted silane and unsubstituted silane) to the total areas of openings 48 (peroxide) is 1.5:1 because a greater concentration of the silane mixture in the reactor would result in lower deposition rates and poor film deposition uniformity.

Preferably, therefore, the ratio of total area of openings 46 (mixture of carbon-substituted silane and unsubstituted silane) to the total areas of openings 48 (peroxide) will range from about 0.5:1 to about 1.5:1, with the actual ratio being determined empirically. Providing such an optimized ratio of reactants will assist in providing a uniform flow of reactants across the showerhead and further will contribute to making the reaction independent of the particular geometry of the reactor. That is, with the use of an optimized showerhead, the reaction can be carried out with repeatable results in different chambers, for example, in the same tool.

The ratio of the respective flows of reactant out of showerhead 20 into the reactor may be controlled or tuned either by enlarging the diameter or by increasing the number of openings 46 in faceplate 44, relative to the areas of the openings 48 in faceplate 44. It should be noted that openings 48 are not enlarged because they are connected to pipes 50 to provide communication between second openings 48 and upper plenum 30, and it would be difficult to change either the number or diameter of such pipes and openings. Since it is desirable to vary the ratio of reactants by increasing the flow of the mixture of carbon-substituted silane and unsubstituted silane rather than to change the flow of hydrogen peroxide into the reactor, the peroxide flow is directed through unchanged openings 48, while adjustment to the flow of the mixture of carbon-substituted silane and unsubstituted silane reactants is made by varying the number or diameter of openings 46 in faceplate 44.

FIG. 3 illustrates the use of a plurality of small openings 46 in faceplate 44 which surround larger openings 48. When it is desired to increase the ratio of the total areas of openings 46 relative to the total areas of openings 48, one may either add further small openings 46, or one may increase the diameter of some or all of openings 46, e.g., by drilling or reaming out some or all of openings 46.

Alternatively, as shown in FIG. 4, one may initially provide larger diameter openings 46' in faceplate 44, i.e., similar in size to openings 48, and then further adjust the ratio of the total areas of openings 46' to the total areas of openings 48 by adding small openings or by further drilling out openings 46' to thereby increase the total effective areas of openings 46'.

Optimization of the showerhead not only includes adjustment of the ratio of the total area of the respective openings through which the reactants flow, but also includes control of the particular aluminum alloy content and control of the surface roughness as well. While we do not wish to be bound by any theories of operation, it appears that the use of an aluminum alloy for the showerhead rather than pure aluminum (99+% aluminum) appears to improve interaction of the hydrogen peroxide reactant with the surface of the substrate on which the low k carbon-substituted silicon oxide dielectric material is being formed. Hydrogen peroxide apparently preferably condenses on the surface of pure aluminum, thus preventing adequate delivery of the hydrogen peroxide to the surface of the substrate. By alloying the aluminum with non-reactive alloying constituents such as carbon, chromium, and/or nickel up to about 10 wt. % total alloying constituents will improve the delivery of the hydrogen peroxide to the surface of the substrate.

The surface roughness of the aluminum faceplate of the showerhead also apparently affects the condensation of hydrogen peroxide which can reduce the amount of hydrogen peroxide delivered to the surface of the substrate. Polishing the faceplate surface to a mirror finish of less than 100 Angstroms variance, along with anodization of the polished surface of the polished aluminum alloy, should significantly improve the delivery of the hydrogen peroxide reactant to the surface of the substrate.

Thus the invention provides an improved process for forming low k carbon-substituted silicon oxide dielectric material wherein the ratio of unsubstituted silane to carbon-substituted silane is adjusted to accelerate the process without, however, increasing the dielectric constant of the low k dielectric product above 3.0, and the ratio of the peroxide reactant to the reactant mixture of carbon-substituted silane and unsubstituted silane is adjusted in the showerhead to improve the reproducibility and chamber geometry independence of the process by adjusting and designing the ratio of the areas of the respective reactant openings in the showerhead of the apparatus. The use of an aluminum alloy rather than pure aluminum for the faceplate, and control of the surface roughness of the faceplate further enhance performance of the reaction.

Having thus described the invention what is claimed is:

1. A process for controlling a reaction between a peroxide oxidizing agent and a carbon-substituted silane to form a low k carbon-containing silicon oxide dielectric material by adding, to the carbon-substituted silane reactant, unsubstituted silane ($SiH_4$), to accelerate the process for forming a low k carbon-containing silicon oxide dielectric material by reaction of the carbon-substituted silane/unsubstituted silane mixture with hydrogen peroxide.

2. The process of claim 1 wherein the minimum amount of unsubstituted silane added to the carbon-substituted silane is that amount which will reduce the reaction time by a desired amount while still depositing the same thickness of the low k dielectric material.

3. The process of claim 1 wherein the minimum amount of unsubstituted silane added to the carbon-substituted silane is that amount which will approximately double the reaction rate of the hydrogen peroxide reactant with the carbon-substituted reactant without any unsubstituted silane present.

4. The process of claim 1 wherein the minimum amount of unsubstituted silane added to the carbon-substituted silane is 3 mole % of the resulting mixture of carbon-substituted silane and unsubstituted silane.

5. The process of claim 1 wherein the maximum amount of unsubstituted silane additive used in the reaction should be the maximum amount of unsubstituted silane additive which is still below that amount of unsubstituted silane additive which will increase the dielectric constant of the product to above 3.1.

6. The process of claim 1 wherein the maximum amount of unsubstituted silane added to the carbon-substituted silane is 27 mole % of the resulting mixture of carbon-substituted silane and unsubstituted silane.

7. A process for controlling a reaction between a peroxide oxidizing agent and a carbon-substituted silane to form a low k carbon-containing silicon oxide dielectric material by adding, to the carbon-substituted silane reactant, unsubstituted silane ($SiH_4$) in an amount ranging from the minimum amount of unsubstituted silane which will reduce the reaction time by a desired amount while still depositing the same thickness of the low k dielectric material up to the maximum amount of unsubstituted silane additive which is still below that amount of unsubstituted silane additive which will increase the dielectric constant of the product to above 3.1, whereby the process for forming a low k carbon-containing silicon oxide dielectric material by reaction of the carbon-substituted silane/unsubstituted silane mixture with hydrogen peroxide is accelerated without increasing the dielectric constant of the low k carbon-containing silicon oxide dielectric product higher than 3.1.

8. The process of claim 7 wherein the amount of unsubstituted silane added to the carbon-substituted silane ranges from at least 3 mole % to not greater than 27 mole % of the resulting mixture of carbon-substituted silane and unsubstituted silane.

9. A process for controlling a reaction between a peroxide oxidizing agent and a reactant mixture comprising carbon-substituted silane and unsubstituted silane to form a low k carbon-containing silicon oxide dielectric material which comprises controlling the ratio of the flow of the hydrogen peroxide reactant and the flow of the reactant mixture of carbon-substituted silane and unsubstituted silane into a reaction chamber by structurally modifying the openings in the faceplate of a showerhead in said reaction chamber through which the reactant mixture of carbon-substituted silane and unsubstituted silane flow into said reaction chamber.

10. The process of claim 9 wherein the sum of the areas of the openings in said faceplate used for flowing said peroxide oxidizing agent into said reaction chamber is maintained at a constant while the sum of the areas of said openings in said faceplate through which said reactant mixture of carbon-substituted silane and unsubstituted silane flow into said reaction chamber is modified.

11. The process of claim 10 wherein said sum of said areas of openings in said faceplate through which said reactant mixture of carbon-substituted silane and unsubstituted silane flow into said reaction chamber is modified by enlarging the inner diameter of at least some of said openings.

12. The process of claim 10 wherein said sum of said areas of openings in said faceplate through which said reactant mixture of carbon-substituted silane and unsubstituted silane flow into said reaction chamber is modified by adding to said faceplate more of said openings for the passage of said reactant mixture of carbon-substituted silane and unsubstituted silane therethrough into said reaction chamber.

13. The process of claim 10 wherein said sum of said areas of openings in said faceplate through which said reactant mixture of carbon-substituted silane and unsubstituted silane flow into said reaction chamber is modified by a combination of:

a) enlarging the inner diameter of at least some of said openings; and b) adding to said faceplate more of said openings for the passage of said reactant mixture of carbon-substituted silane and unsubstituted silane therethrough into said reaction chamber.

14. The process of claim 9 wherein said faceplate comprises an aluminum alloy.

15. The process of claim 13 wherein said aluminum alloy includes at least one non-reactive alloying constituent selected from the group consisting of carbon, chromium, and nickel.

16. The process of claim 14 wherein said aluminum faceplate is polished to less than 100 Angstrom variance.

17. The process of claim 16 which further includes anodizing said polished aluminum faceplate.

18. A process for controlling a reaction between a peroxide oxidizing agent and carbon-substituted silane to form a low k carbon-containing silicon oxide dielectric material which comprises:
   a) adding, to the carbon-substituted silane reactant, unsubstituted silane ($SiH_4$), to accelerate the process for forming a low k carbon-containing silicon oxide dielectric material by reaction of the resulting reactant mixture of carbon-substituted silane/unsubstituted silane mixture with a hydrogen peroxide reactant; and
   b) controlling the ratio of the flow of said hydrogen peroxide reactant and the flow of said reactant mixture of carbon-substituted silane and unsubstituted silane into a reaction chamber by structurally modifying openings in a faceplate of a showerhead in said reaction chamber through which said reactant mixture of carbon-substituted silane and unsubstituted silane flows into said reaction chamber.

19. The process of claim 18 wherein the minimum amount of unsubstituted silane added to said carbon-substituted silane is that amount which will reduce the reaction time by a desired amount while still depositing the same thickness of said low k dielectric material.

20. The process of claim 18 wherein the minimum amount of unsubstituted silane added to said carbon-substituted silane is that amount which will approximately double the reaction rate of said hydrogen peroxide reactant with said carbon-substituted reactant without any unsubstituted silane present.

21. The process of claim 18 wherein the minimum amount of unsubstituted silane added to said carbon-substituted silane is 3 mole % of the resulting mixture of carbon-substituted silane and unsubstituted silane.

22. The process of claim 18 wherein the maximum amount of unsubstituted silane additive used in the reaction should be the maximum amount of unsubstituted silane additive which is still below that amount of unsubstituted silane additive which will increase the dielectric constant of the product to above 3.1.

23. The process of claim 18 wherein the maximum amount of unsubstituted silane added to said carbon-substituted silane is 27 mole % of the resulting mixture of carbon-substituted silane and unsubstituted silane.

24. The process of claim 18 wherein the sum of the areas of the openings in said faceplate used for flowing said peroxide oxidizing agent into said reaction chamber is maintained at a constant while the sum of the areas of said openings in said faceplate through which said reactant mixture of carbon-substituted silane and unsubstituted silane flow into said reaction chamber is modified.

25. The process of claim 24 wherein said sum of said areas of openings in said faceplate through which said reactant mixture of carbon-substituted silane and unsubstituted silane flow into said reaction chamber is modified by enlarging the inner diameter of at least some of said openings.

26. The process of claim 24 wherein said sum of said areas of openings in said faceplate through which said reactant mixture of carbon-substituted silane and unsubstituted silane flow into said reaction chamber is modified by adding to said faceplate more of said openings for the passage of said reactant mixture of carbon-substituted silane and unsubstituted silane therethrough into said reaction chamber.

27. The process of claim 24 wherein said sum of said areas of openings in said faceplate through which said reactant mixture of carbon-substituted silane and unsubstituted silane flow into said reaction chamber is modified by a combination of:
   a) enlarging the inner diameter of at least some of said openings; and
   b) adding to said faceplate more of said openings for the passage of said reactant mixture of carbon-substituted silane and unsubstituted silane therethrough into said reaction chamber.

* * * * *